(12) United States Patent
Brar et al.

(10) Patent No.: US 11,909,192 B2
(45) Date of Patent: Feb. 20, 2024

(54) HIGH-VOLTAGE JUNCTION BOX WIRE TRAY

(71) Applicant: LEAR CORPORATION, Southfield, MI (US)

(72) Inventors: Parminder Brar, Ontario (CA); Michael Scott Duco, Fraser, MI (US); Rutunj Rai, Canton, MI (US); Jared Pieknik, Westland, MI (US)

(73) Assignee: LEAR CORPORATION, Southfield, MI (US)

( * ) Notice: Subject to any disclaimer, the term of this patent is extended or adjusted under 35 U.S.C. 154(b) by 201 days.

(21) Appl. No.: 17/342,021

(22) Filed: Jun. 8, 2021

(65) Prior Publication Data

US 2021/0408773 A1 Dec. 30, 2021

Related U.S. Application Data (60) Provisional application No. 63/044,652, filed on Jun. 26, 2020.

(51) Int. Cl.
*B60L 53/30* (2019.01)
*H02B 1/20* (2006.01)
(Continued)

(52) U.S. Cl.
CPC .............. *H02G 3/081* (2013.01); *B60L 53/30* (2019.02); *H02B 1/20* (2013.01); *H02J 7/0042* (2013.01); *H05K 7/1427* (2013.01)

(58) Field of Classification Search
CPC . B60K 17/16; B60K 6/26; B60K 6/28; B60K 6/46; B60L 15/007; B60L 50/51;
(Continued)

(56) References Cited

U.S. PATENT DOCUMENTS 9,335,786 B2 * 5/2016 Stewart ..................... G06F 1/16
9,627,894 B1 * 4/2017 Mayer .................. H02M 7/537
(Continued)

FOREIGN PATENT DOCUMENTS

CN 1783688 A 6/2006
CN 102394446 A 3/2012
(Continued)

OTHER PUBLICATIONS

Level 1 & Level 2 EVSE Design_Texas Instrument_pp. 1-36_Feb 2016.*
(Continued)

*Primary Examiner* — Timothy J Thompson
*Assistant Examiner* — Guillermo J Egoavil
(74) *Attorney, Agent, or Firm* — BROOKS KUSHMAN P.C.

(57) ABSTRACT

An electronic module is provided with a housing with an inlet to conduct alternating current (AC) power and an outlet to conduct direct current (DC) power to charge a vehicle battery, the housing defining a cavity. A circuit board assembly is supported within the cavity to convert the AC power to DC power. At least two power distribution wires are connected between the circuit board assembly and the outlet. A base is supported by the housing and extends between the at least two power distribution wires and the circuit board assembly to shield the DC power from electromagnetic interference generated by the circuit board assembly. A plurality of walls extend transversely from the base and are spaced apart from each other to define at least two channels, each channel is sized to receive one of the at least two power distribution wires.

20 Claims, 5 Drawing Sheets

(51) Int. Cl.
*H02G 3/08* (2006.01)
*H02J 7/00* (2006.01)
*H05K 7/14* (2006.01)

(58) Field of Classification Search
CPC .. B60L 53/30; B60L 2210/40; B60L 2220/14;
B60L 2240/429; B60Y 2200/92; H01L
2224/36; H01L 2224/40; H01L
2224/40137; H01L 2224/45099; H01L
23/3121; H01L 23/36; H01L 23/3675;
H01L 23/473; H01L 23/492; H01L
23/49517; H01L 24/40; H01L 24/45;
H01L 25/072; H01L 2924/00; H01L
2924/00012; H01L 2924/00014; H01L
2924/0002; H01L 2924/1203; H01L
2924/13055; H01L 2924/13091; H01L
2924/14; H01L 2924/181; H02B 1/20;
H02G 3/0437; H02G 3/0493; H02G
3/081; H02G 3/083; H02G 3/086; H02G
3/08; H02J 7/0042; H02J 7/00; H02M
7/003; H02M 7/537; H02P 27/06; H05K
1/0262; H05K 7/1427; H05K 7/14329;
H05K 7/14; H05K 7/2089; H05K
7/20927; Y02T 10/70; Y02T 10/7072;
Y02T 90/12; Y10S 903/906; Y10S
903/907; Y10S 903/909
USPC .................................................. 361/622, 699
See application file for complete search history.

(56) References Cited

U.S. PATENT DOCUMENTS

| | | | |
|---|---|---|---|
| 10,778,117 B2 | 9/2020 | Song et al. | |
| 10,779,445 B2 | 9/2020 | Chung et al. | |
| 10,804,661 B1 | 10/2020 | Burke et al. | |
| 2006/0072277 A1* | 4/2006 | Schmidt | H02G 3/0437 361/119 |
| 2009/0231811 A1* | 9/2009 | Tokuyama | H02M 7/537 361/699 |
| 2013/0140055 A1 | 6/2013 | Adachi | |

FOREIGN PATENT DOCUMENTS

| | | | | |
|---|---|---|---|---|
| CN | 107852843 A | | 3/2018 | |
| CN | 109119854 A | | 1/2019 | |
| CN | 110581656 A | * | 12/2019 | ............ H02M 7/003 |
| DE | 102016203553 A1 | | 9/2017 | |
| JP | 2019149909 A | | 9/2019 | |
| WO | 2020227458 A1 | | 11/2020 | |

OTHER PUBLICATIONS

Thesis Compact AC-DC Module EV Charging_Alerman et al._ pp. 1-111_2018.*
Vehicle Control & Power Conversion_Eaton_pp. 1-128_Apr 2015.*
Office Action of Chinese patent application No. 202110702482.5 dated Nov. 10, 2023, 6 pages.

* cited by examiner

HIGH-VOLTAGE JUNCTION BOX WIRE TRAY

CROSS-REFERENCE TO RELATED APPLICATIONS

This application claims the benefit of U.S. provisional application Ser. No. 63/044,652 filed Jun. 26, 2020, the disclosure of which is hereby incorporated in its entirety by reference herein.

TECHNICAL FIELD

One or more embodiments relate to a wire tray for a vehicle high-voltage junction box.

BACKGROUND

Electrified vehicles, including pure electric vehicles and hybrid electric vehicles, include a high-voltage battery pack that is used for propulsion or "traction" of the vehicle, and may be referred to as a traction battery. Such electrified vehicles include power electronics for converting power supplied to and from the traction battery. Such power electronics generate electromagnetic energy that may affect other systems and components. Electromagnetic compatibility (EMC) refers to the ability of electrical equipment and systems to function acceptably in their electromagnetic environment, by limiting the unintentional generation, propagation and reception of electromagnetic energy which may cause unwanted effects such as electromagnetic interference (EMI) in operational equipment.

SUMMARY

In one embodiment, an electronic module is provided with a housing with an inlet to conduct alternating current (AC) power and an outlet to conduct direct current (DC) power to charge a vehicle battery, the housing defining a cavity. A circuit board assembly is supported within the cavity to convert the AC power to DC power. At least two power distribution wires are connected between the circuit board assembly and the outlet. A base is supported by the housing and extends between the at least two power distribution wires and the circuit board assembly to shield the DC power from electromagnetic interference generated by the circuit board assembly. A plurality of walls extend transversely from the base and are spaced apart from each other to define at least two channels, each channel is sized to receive one of the at least two power distribution wires.

In another embodiment, a wire tray is provided with a base that is adapted to be supported by a housing within a cavity and extend between an inverter, and first and second power distribution wires. A plurality of walls extend transversely from the base and are spaced apart from each other to define a first channel and a second channel, wherein the first channel is sized to receive the first power distribution wire and the second channel is sized to receive the second power distribution wire. A conductor is disposed within the base and adapted to connect to a vehicle chassis to provide a ground path for electromagnetic interference generated by the inverter and shield the first and second power distribution wires.

In yet another embodiment, a method is provided for manufacturing an electronic module. An electrically insulative material is molded over a conductor to form a wire tray. The wire tray is disposed within a housing and between an inverter and power distribution wires, connected between the inverter and an outlet of the housing. The conductor connects to a vehicle chassis to provide a ground path for electromagnetic interference generated by the inverter.

In one embodiment a high-voltage (HV) junction box is provided with a housing to mount to a vehicle chassis with an inlet for receiving AC power and an outlet for providing HV DC power. A circuit board assembly is supported by the housing and includes components for converting the AC power to HV DC power. At least two power distribution wires are connected to the circuit board to facilitate DC power flow. A tray is supported by the housing and extends over a portion of the circuit board and between the circuit board and the at least two power distribution wires to shield the HV DC power from electromagnetic interference generated by the circuit board assembly.

The present invention also provides an electronic module is provided with a housing to mount to a vehicle chassis with an inlet for receiving AC power and an outlet for providing DC power. A circuit board assembly is supported by the housing and includes components for converting the AC power to DC power. At least two power distribution wires are connected to the circuit board to facilitate DC power flow. A tray is supported by the housing and extends over a portion of the circuit board and between the circuit board and the at least two power distribution wires to shield the DC power from electromagnetic interference generated by the circuit board assembly.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
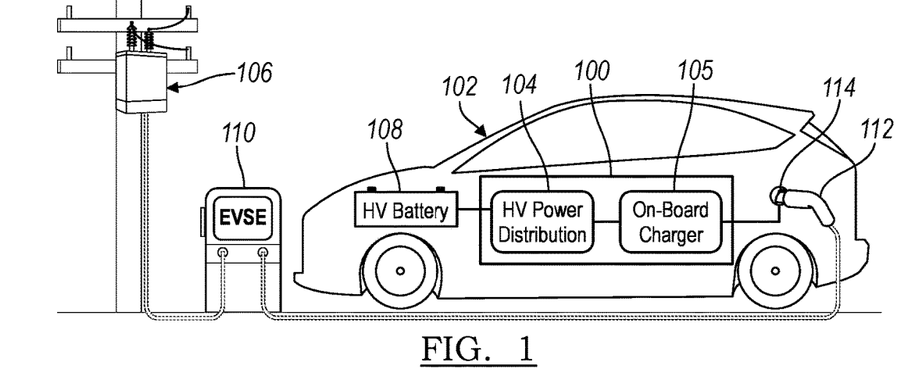
FIG. 1 is a schematic diagram of an electrified vehicle with a high-voltage junction box according to one or more embodiments.

With reference to FIG. 1, an electronic module, such as a high-voltage junction box (HVJB) is illustrated in accordance with one or more embodiments and generally referenced by numeral 100. The HVJB 100 is depicted within a vehicle 102 and includes a high-voltage (HV) power distribution module 104 and an on-board charger (OBC) 105. The HVJB 100 electrically connects an external power supply 106 to a traction battery 108 to facilitate charging. The OBC 105 and the HV power distribution module 104 collectively condition the power supplied from the external power supply 106 to provide the proper voltage and current levels to the traction battery 108.

The external power supply 106 is electrically coupled to electric vehicle supply equipment (EVSE) 110, e.g., a charger or a charging station. The external power supply 106 is an electrical power distribution network or grid as provided by an electric utility company, according to one or more embodiments. The EVSE 110 provides circuitry and controls to regulate and manage the transfer of energy between the external power supply 106 and the vehicle 102. The external power supply 106 provides AC electric power to the EVSE 110. The EVSE 110 includes a charge connector 112 for plugging into a charge port 114 of the vehicle 102. The charge port 114 may be any type of port to transfer power from the EVSE 110 to the HVJB 100. The HVJB 100 converts the AC power received from the EVSE 110 to a high-voltage (HV) DC power output for charging the traction battery 108. This might typically in the hundreds of volts, such as a voltage of 300 volts or more.

Figure 2:
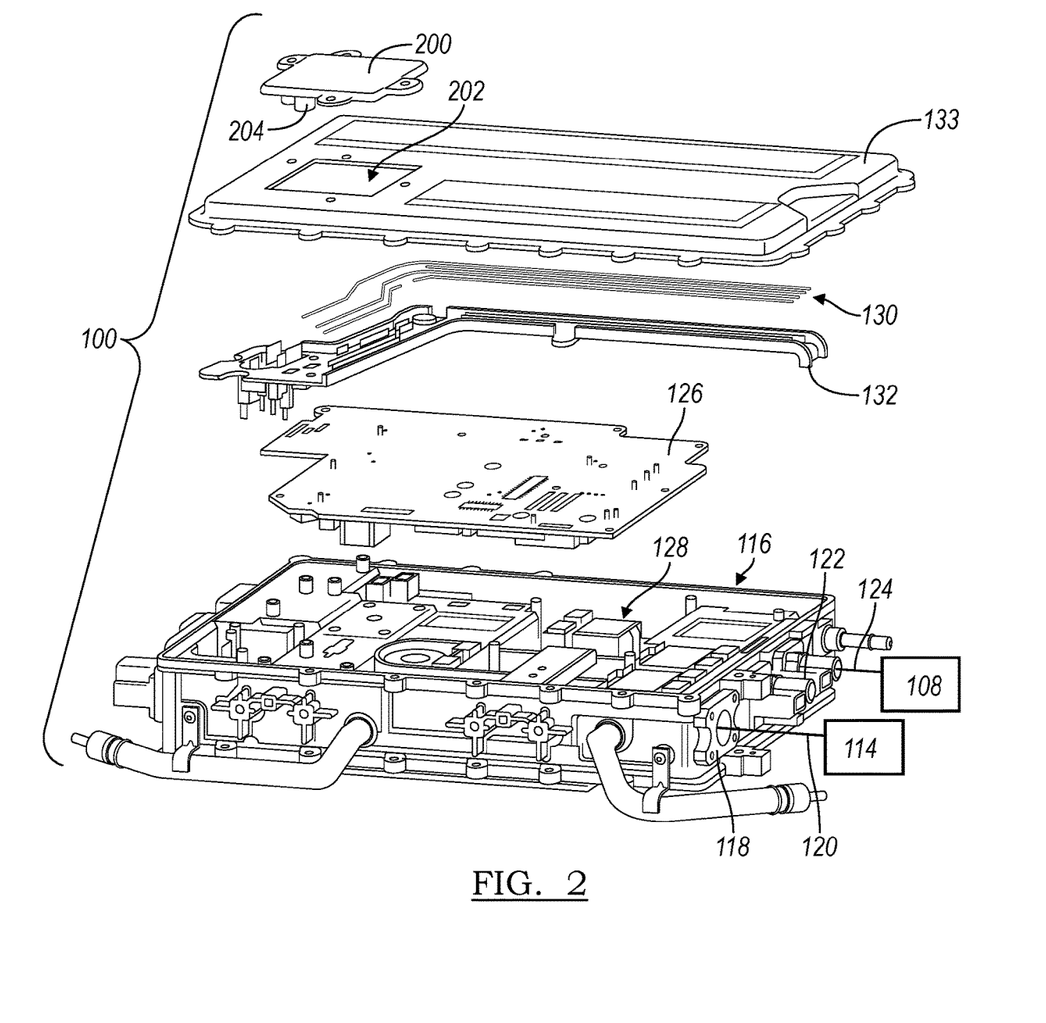
FIG. 2 is an exploded top perspective view of the high-voltage junction box, illustrating a tray.

Referring to FIG. 2, the HVJB 100 includes a housing 116 that mounts to a vehicle chassis (not shown). The housing 116 includes an inlet 118 that connects to the charge port 114 by an AC harness 120 for receiving AC power. The housing 116 also includes an outlet 122 that connects to the traction battery 108 by a DC harness 124. The HVJB 100 also includes a circuit board assembly 126 that is supported within a cavity 128 formed in the housing 116. The circuit board assembly 126 includes an inverter, such as power electronics for converting the AC power to high-voltage (HV) DC power. Such power conversion generates heat. The housing 116 may be coupled to a coolant system (not shown) for cooling the HVJB 100. The HVJB 100 includes power distribution wires 130 that are connected between a DC side of the circuit board assembly 126 and the DC outlet 122.

The HVJB 100 includes a tray 132 that mounts to the housing 116 and supports the power distribution wires 130. The tray 132 extends over a portion of the circuit board assembly 126 and separates the power distribution wires 130 from the circuit board assembly 126. The HVJB 100 also includes a cover 133 for enclosing the circuit board assembly 126, power distribution wires 130 and tray 132 within the cavity 128 of the housing 116.

Figure 3:
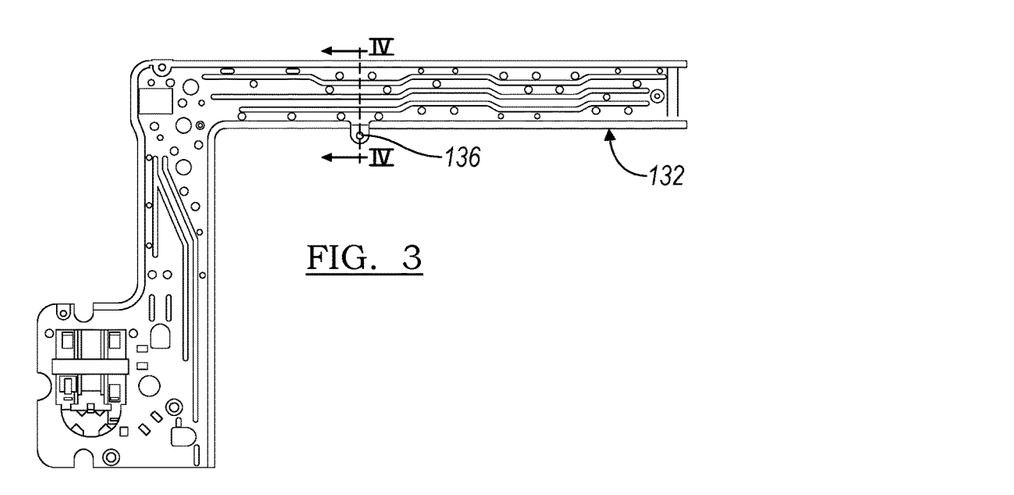
FIG. 3 is a top view of the tray of FIG. 2.
Figure 4:
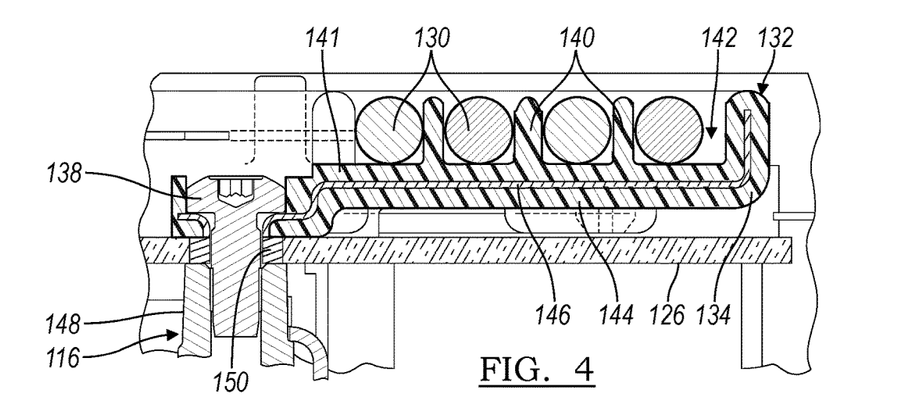
FIG. 4 is an enlarged section view of the tray of FIG. 3 taken along section line IV-IV.

With reference to FIGS. 3 and 4, the tray 132 includes a base 134 that extends over a portion of the circuit board assembly 126. The base 134 includes an aperture 136 that is sized to receive a fastener 138 for mounting the tray 132 to the housing 116. The tray 132 includes a plurality of walls 140 that extend transversely from a first surface 141 of the base 134. The walls 140 are spaced apart from each other to define channels 142 for receiving the power distribution wires 130. In one or more embodiments, the wall spacing defines channels 142 that are each sized to receive one power distribution wire 130.

The tray 132 provides a barrier between the power distribution wires 130 and the circuit board assembly 126. The tray 132 is formed with insulative material 144 disposed over a conductor 146. The conductor 146 may be formed as a sheet that extends between the power distribution wires 130 and the circuit board assembly 126. In one embodiment, the tray 132 is formed with a sheet metal conductor 146 that is over-molded with an insulative polymeric material 144. The conductor 146 contacts the fastener 138 within the aperture 136, which engages a threaded boss 148 of the housing 116, and the housing 116 is mounted to the vehicle chassis. The fastener 138 and the housing 116 are formed of conductive materials and provide a ground path to the chassis ground. The conductor 146 of the tray 132 conducts electromagnetic interference generated by the power electronics of the circuit board assembly 126 to the ground path to shield the HV DC power within the power distribution wires 130 from electromagnetic interference. In one or more embodiments, the circuit board assembly 126 also connects to the ground path. As shown in FIG. 4, the circuit board assembly 126 may include an aperture 150 with a conductive inner diameter surface, e.g., a via, that contacts the conductor 146.

Figure 5:
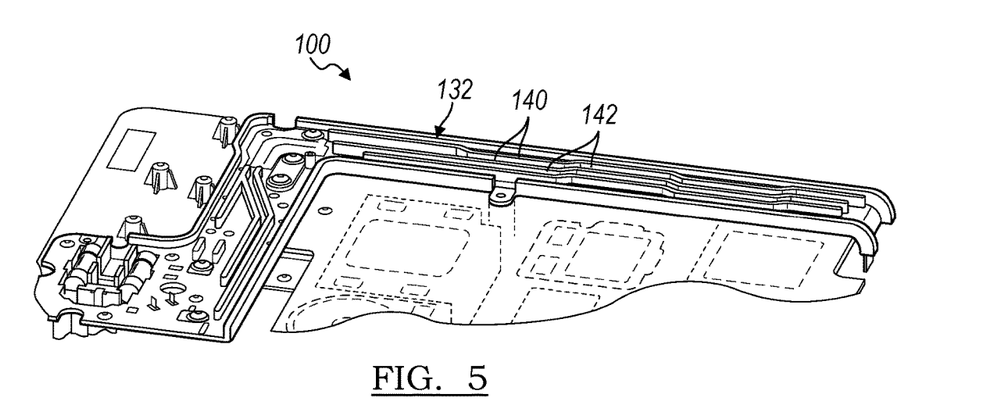
FIG. 5 is a top perspective view of the high-voltage junction box.
Figure 6:
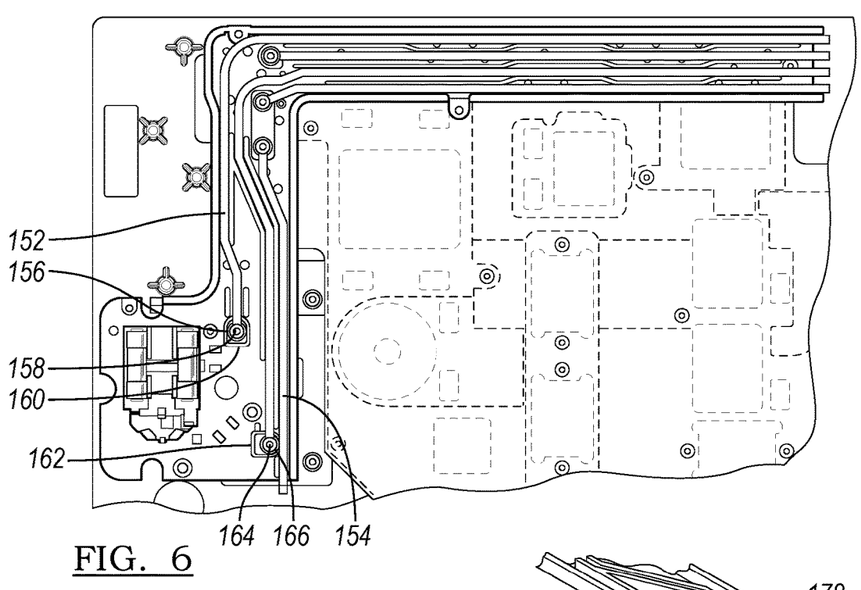
FIG. 6 is a top view of the high-voltage junction box, illustrating a wire routing aid.

With reference to FIGS. 5 and 6, the tray 132 provides a wire routing aid during the assembly of the HVJB 100. The walls 140 of the tray 132 are spaced apart from each other to define channels 142 for receiving the power distribution wires 130. In one or more embodiments, the power distribution wires 130 include a first wire 152 that is shorter than a second wire 154. The different wire lengths combined with wall spacing that defines channels 142 that are each sized to receive one power distribution wire 130, collectively provide a poke-yoke or assembly aid that prevents incorrect wire routing.

In another embodiment, the walls 140 of the tray 132 extend to form receptacles having different shapes to accommodate certain connectors. The first power distribution wire 152 has an in-line connector 156 that engages a first post 158 within an in-line receptacle 160. The second power distribution wire 154 has a transverse connector 162 that engages a second post 164 within a transverse receptacle 166. The in-line receptacle 160 will not receive the transverse connector 162 and the transverse receptacle 166 will not receive the in-line connector 156, which limits incorrect assembly.

Figures 7, 8:
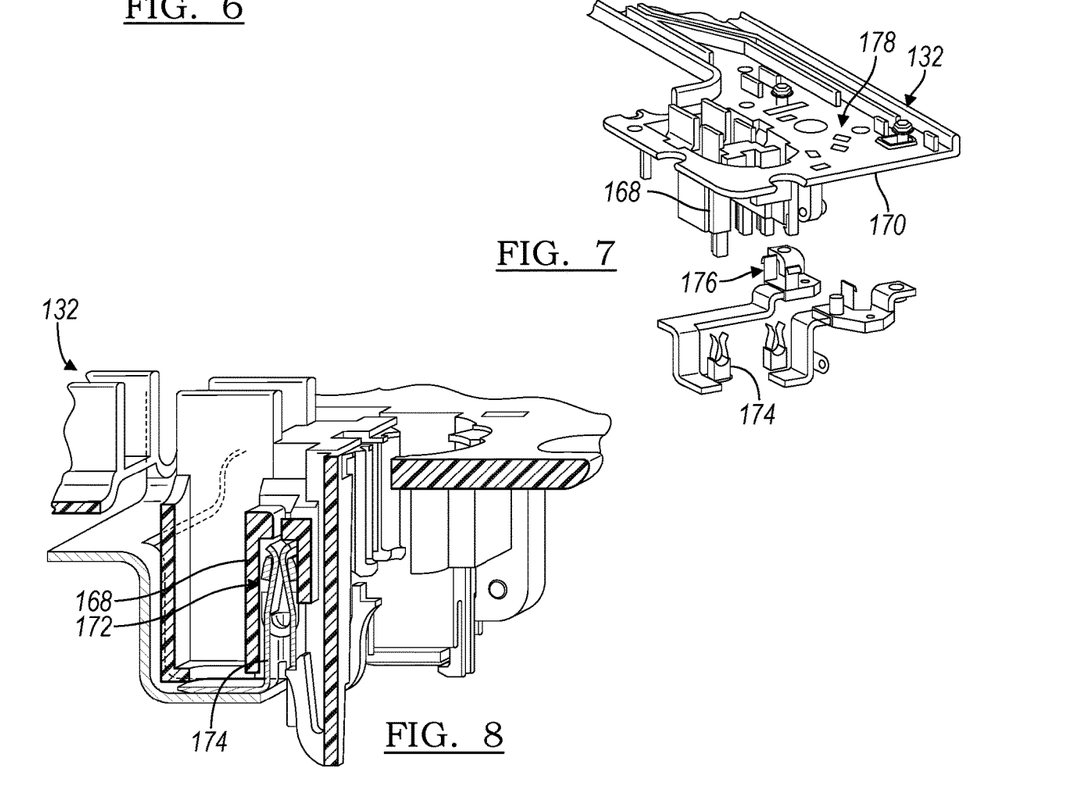
FIG. 7 is an exploded side perspective view of the tray, illustrating an integrated connector.
FIG. 8 is an enlarged section view of the integrated connector of FIG. 7.

Referring to FIGS. 7 and 8, in one or more embodiments the tray 132 retains terminals to function as an integrated connector. An electrical wiring connection typically includes two connector housings: a male connector housing and a female connector housing that mate with each other. Each connector housing includes male or female terminals that mate with terminals of the other connector housing. The tray 132 includes walls 168 that extend transversely from a second surface 170 of the base 134 to define terminal cavities 172 and function as an integrated connector housing. The HVJB 100 includes terminals 174 that are each received within a terminal cavity 172. Each terminal 174 may be retained within a terminal cavity 172 by a pair of tabs 176 that extend through apertures 178 formed in the base 134 of the tray 132.

Figure 9:
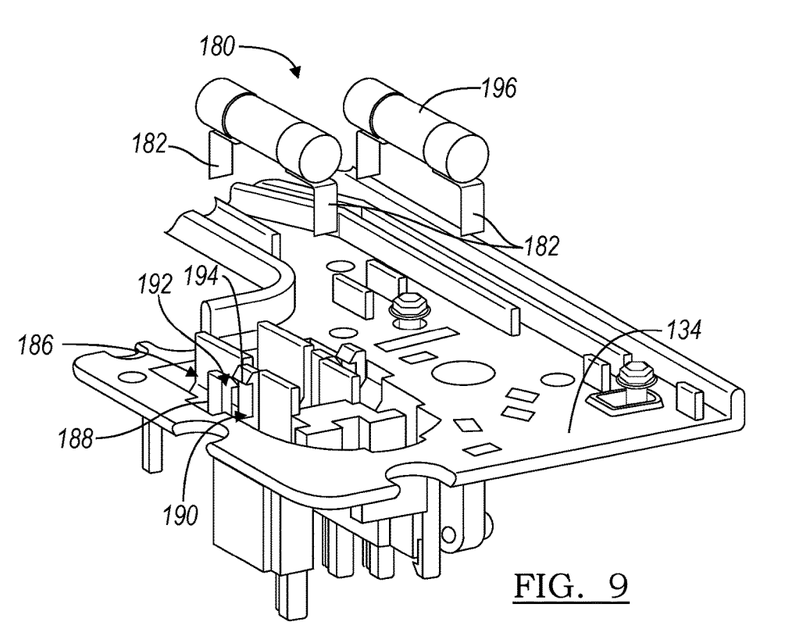
FIG. 9 is an exploded side perspective view of the tray.
Figure 10:
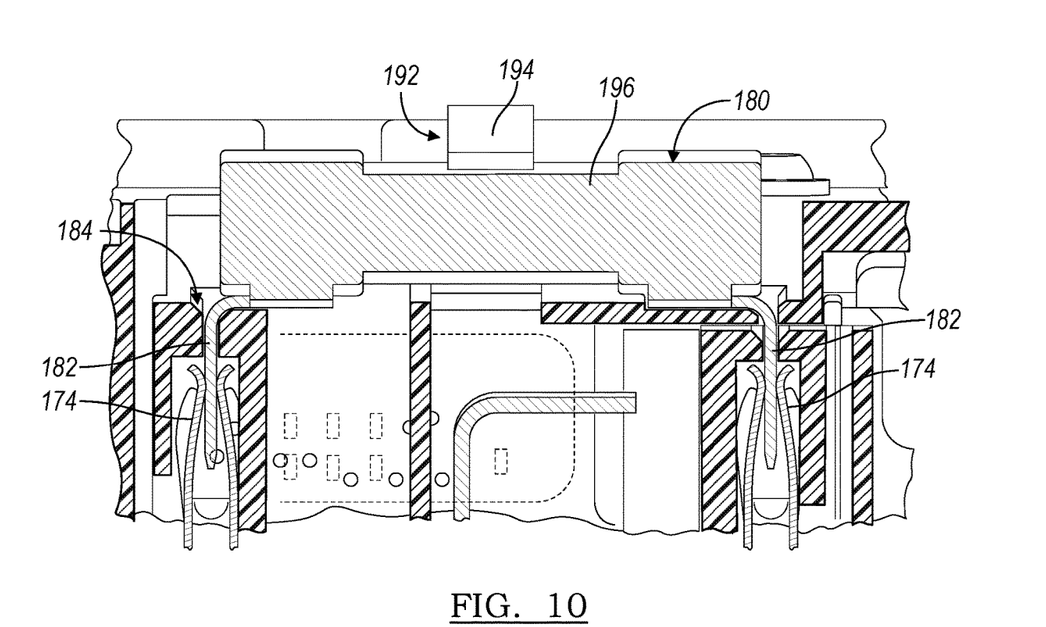
FIG. 10 is an enlarged section view of the tray, illustrating a fuse connected to the integrated connector.

With reference to FIGS. 9 and 10, the tray 132 supports components that mate with the terminals 174, according to one or more embodiments. The terminals 174 may be female terminals. The HVJB 100 may include discrete removable electrical components, e.g., a pair of fuses 180, each with two leads 182 that extend through openings 184 formed through the base 134 to engage and electrically connect with the terminals 174.

The tray 132 may include clips 186 that retain the fuses 180. Each clip 186 includes a pair of posts 188 that extend transversely from the base 134 and are spaced apart from each other to form a pocket 190. A retention tab 192 extends from a distal end of each post 188 toward the retention tab 192 of an adjacent post 188. The retention tabs 192 are formed with an angled top surface 194 to provide a lead-in for receiving a body 196 of the fuse 180. The clips 186 are formed of flexible material, such that the posts 188 bend away from each other to receive the body of the fuse 180, then the posts return to their initial position to retain the fuse 180.

Figure 11:
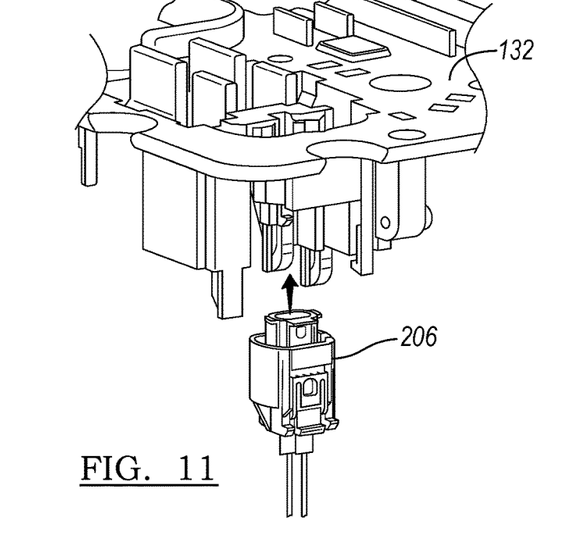
FIG. 11 is an exploded side perspective view of the tray.
Figure 12:
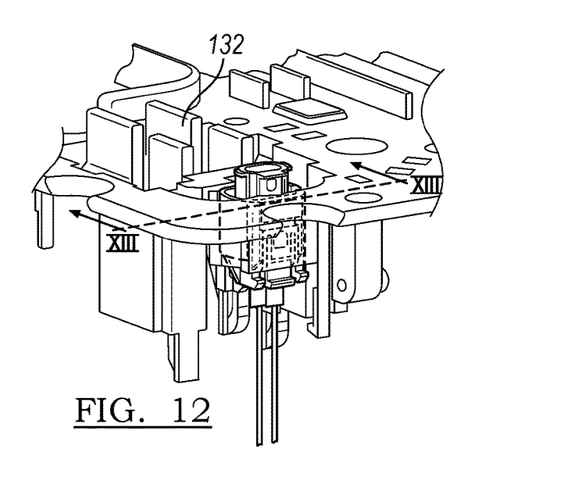
FIG. 12 is a side perspective view of the tray.
Figure 13:
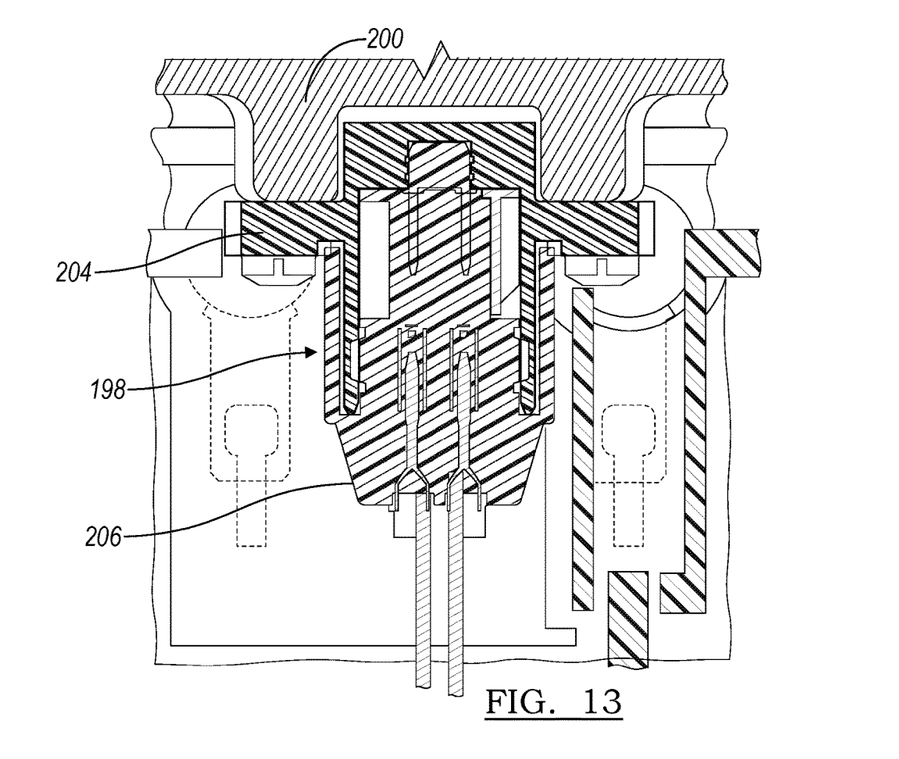
FIG. 13 is an enlarged section view of the tray of FIG. 12 taken along section line XIII-XIII.

With reference to FIGS. 11-13, the tray 132 includes a High-voltage interlock loop (HVIL) detection mechanism 198 that indicates if someone has tampered with or otherwise removed a fuse cover 200. Referring back to FIG. 1, the cover 133 includes an opening 202 that is arranged over the fuses 180. The fuse cover 200 may be removed to service the fuses 180 without removing the larger cover 133. The HVIL detection mechanism 198 includes a first connector 204 that is connected to the fuse cover 200 and a second connector 206 that is secured to the tray 132. When a user removes the fuse cover 200, the first connector 204 disconnects from the second connector 206 and disconnects the power distribution wires 130 from the circuit board assembly 126 to disable the high-voltage.

The tray 132 provides functional improvements over existing HVJB technology by creating EMI shielding between power distribution wires and the power electronics of circuit board assemblies. The tray 132 also provides wire routing aids that will reduce assembly time, and integrates features to eliminate components, both of which may result in cost reduction.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic module comprising:
   a housing with an inlet to conduct alternating current (AC) power and an outlet to conduct direct current (DC) power to charge a vehicle battery, the housing defining a cavity;
   a circuit board assembly supported within the cavity to convert the AC power to DC power;
   at least two power distribution wires connected between the circuit board assembly and the outlet;
   a base supported by the housing and extending between the at least two power distribution wires and the circuit board assembly to shield the DC power from electromagnetic interference generated by the circuit board assembly; and
   a plurality of walls extending transversely from the base and spaced apart from each other to define at least two channels, each channel sized to receive one of the at least two power distribution wires.

2. The electronic module of claim 1, further comprising a conductor disposed in the base and adapted to connect to a vehicle chassis to provide a ground path for the electromagnetic interference generated by the circuit board assembly.

3. The electronic module of claim 2, wherein the base further comprises electrically insulative material disposed over the conductor.

4. The electronic module of claim 1, wherein the at least two channels further define a first channel and a second channel, and wherein the plurality of walls further define:
   a first receptacle coupled to the first channel to receive a first connector, and
   a second receptacle coupled to the second channel to receive a second connector, and not receive the first connector, to limit incorrect assembly.

5. The electronic module of claim 1, wherein the plurality of walls further define a terminal cavity, and wherein an opening is formed through the base and aligned with the terminal cavity, the electronic module further comprising a terminal mounted to the base and extending into the terminal cavity.

6. The electronic module of claim 5, further comprising an electrical component with a body and a lead extending from the body and through the opening of the base to engage the terminal.

7. The electronic module of claim 6, further comprising:
   a pair of posts extending from the base and spaced apart from each other to define a pocket sized to receive the body of the electrical component; and
   a retention tab extending transversely from a distal end of each of the pair of posts to engage the body of the electrical component during insertion and pivot each post outward to receive the body of the electrical component within the pocket.

8. The electronic module of claim 7, wherein the electrical component comprises a fuse.

9. The electronic module of claim 1, further comprising:
   a first cover to connect to the housing and enclose the cavity, the first cover having an access opening formed through; and
   a second cover to removably mount to the first cover over the access opening to provide external access to a portion of the cavity without disconnecting the first cover from the housing.

10. The electronic module of claim 9, further comprising:
    a first connector mounted to an underside of the base about an opening formed through; and
    a second connector mounted to an inside surface of the second cover to mate with the first connector, wherein removal of the second cover from the first cover disconnects the second connector from the first connector to disconnect the power distribution wires from the circuit board assembly.

11. The electronic module of claim 1, wherein
    the base is supported by the housing within a cavity and extends between an inverter, and the at least two power distribution wires, wherein the inverter comprises the circuit board assembly and the at least two power distribution wires comprise first and second power distribution wires;
    wherein the at least two channels comprise a first channel and a second channel, wherein the first channel is sized to receive the first power distribution wire and the second channel is sized to receive the second power distribution wire; and
    a conductor disposed within the base and adapted to connect to a vehicle chassis to provide a ground path for electromagnetic interference generated by the inverter and shield the first and second power distribution wires.

12. The electronic module of claim 11, wherein the conductor is formed as a sheet that extends between the first and second power distribution wires and the inverter, and wherein the electronic module further comprises electrically insulative material disposed over the conductor.

13. The electronic module of claim 11, wherein the plurality of walls further define:
   a first receptacle coupled to the first channel to receive a first connector, and
   a second receptacle coupled to the second channel to receive a second connector, and not receive the first connector, to limit incorrect assembly.

14. The electronic module of claim 11, wherein the plurality of walls further define a terminal cavity, and wherein an opening is formed through the base and aligned with the terminal cavity to receive a lead of an electrical component, the electronic module further comprising a terminal mounted to an underside of the base and extending into the terminal cavity to engage the lead.

15. The electronic module of claim 14, further comprising:
   a pair of posts extending from the base and spaced apart from each other to define a pocket sized to receive a body of the electrical component; and
   a retention tab extending transversely from a distal end of each of the pair of posts to engage the body of the electrical component during insertion and pivot each post outward to receive the body of the electrical component within the pocket.

16. The electronic of claim 11,
   wherein the housing defines the cavity and is adapted to mount to the vehicle chassis,
   the electronic module further comprising:
      the inverter, wherein the inverter converts AC power to DC power; and
      the first and second power distribution wires, wherein the first and second power distribution wires connect the inverter to the outlet.

17. The electronic module of claim 16, further comprising:
   a first cover to connect to the housing and enclose the base within the cavity, the first cover having an access opening formed through;
   a second cover to removably mount to the first cover over the access opening to provide external access to a portion of the cavity without disconnecting the first cover from the housing;
   a first connector mounted to the base and connected to the inverter; and
   a second connector mounted to an inside surface of the second cover to mate with the first connector to electrically connect the inverter to the first and second power distribution wires.

18. A method for manufacturing the electronic module of claim 1 comprising:
   molding an electrically insulative material over a conductor to form a wire tray;
   disposing the wire tray within the housing and between an inverter and the at least two power distribution wires that are connected between the inverter and the outlet of the housing, the inverter comprising the circuit board assembly; and
   connecting the conductor to a vehicle chassis to provide a ground path for electromagnetic interference generated by the inverter.

19. The method of claim 18, further comprising individually routing each of the at least two power distribution wires within a channel of the at least two channels formed in the wire tray.

20. The method of claim 18, further comprising disconnecting the at least two power distribution wires from the inverter by removing a cover from the housing.

* * * * *